United States Patent
Tang et al.

(10) Patent No.: US 8,643,391 B2
(45) Date of Patent: Feb. 4, 2014

(54) RC CALIBRATION USING CHOPPING

(75) Inventors: William W. K. Tang, Hong Kong (HK); Michael J. Mills, Austin, TX (US); Péter Onódy, Budapest (HU); Gerald D. Champagne, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 230 days.

(21) Appl. No.: 13/250,247

(22) Filed: Sep. 30, 2011

(65) Prior Publication Data

US 2013/0082720 A1    Apr. 4, 2013

(51) Int. Cl.
*G01R 27/08* (2006.01)
(52) U.S. Cl.
USPC ............................. 324/711; 324/135; 324/677
(58) Field of Classification Search
USPC .......................................... 324/667, 135, 711
See application file for complete search history.

(56) References Cited

U.S. PATENT DOCUMENTS

| | | | |
|---|---|---|---|
| 5,929,713 A * | 7/1999 | Kubo et al. | 331/49 |
| 6,262,603 B1 | 7/2001 | Mohan et al. | |
| 7,078,961 B2 * | 7/2006 | Punzenberger et al. | 327/553 |
| 7,816,978 B1 | 10/2010 | Lo et al. | |
| 2009/0115538 A1 * | 5/2009 | Gaede | 331/1 R |
| 2011/0051850 A1 * | 3/2011 | Cha et al. | 375/319 |
| 2011/0279175 A1 | 11/2011 | Kuo et al. | |
| 2012/0056651 A1 * | 3/2012 | Shen et al. | 327/156 |

* cited by examiner

*Primary Examiner* — Huy Q Phan
*Assistant Examiner* — Dustin Dickinson
(74) *Attorney, Agent, or Firm* — Meyertons, Hood, Kivlin, Kowert & Goetzel, P.C.; Erik A. Heter

(57) ABSTRACT

A method and apparatus for determining an RC (resistive-capacitive) time constant is disclosed. In one embodiment, a method comprises determining a first period of oscillation when an oscillator is operating in a first configuration. The method further comprises determining a second period of oscillation when the oscillator is operating in a second configuration. A measurement circuit is configured to determine a resistive-capacitive (RC) time constant of the oscillator by determining a mean of the first and second periods.

20 Claims, 5 Drawing Sheets

US 8,643,391 B2

RC CALIBRATION USING CHOPPING

BACKGROUND

1. Field of the Invention

This invention relates to electronic circuits, and more particularly, to the calibration of resistive-capacitive (RC) time constants for electronic circuits.

2. Description of the Related Art

An RC time constant is a value, measure in units of time, indicating the amount of time required to charge a capacitor to approximately 63.2% of its full charge through a resistor. For an integrated circuit (IC) or various circuits thereof, an RC time constant can be a very important parameter affecting the operation of various circuits therein. For example, an RC time constant can affect switching times of some circuits, determining the amount of time required to switch from a first state to a second state in digital circuitry.

A simple way to measure an RC time constant is to measure a resistance, measure a capacitance, and multiply the two together. The product results in the RC time constant. The obtained RC time constant may be used to determine various performance metrics of the circuitry from which the reading is obtained. In some cases, the RC time constant may be calibrated by implementing variable resistances and capacitances in the circuitry (e.g., an IC) to which it applies.

SUMMARY OF THE DISCLOSURE

A method and apparatus for determining an RC (resistive-capacitive) time constant is disclosed. In one embodiment, a method comprises operating an oscillator in a first configuration, and determining a first period of an oscillator output signal. The method further includes operating the oscillator in a second configuration and determining a second period of the oscillator output signal. The first and second periods may be averaged, with the resulting mean approximating the RC time constant.

In one embodiment, the method for determining the RC time constant may be implemented by an RC oscillator. The RC oscillator may include a capacitor, a resistor, and comparator having first and second inputs coupled to the capacitor and the resistor, respectively. The comparator is configured to compare the voltage across the capacitor to the voltage across the resistor. In the first configuration, a first current source is coupled to the capacitor and the first input, while the second current source is coupled to the resistor and the second input. In the second configuration, the first current source and the capacitor are coupled to the second input, while the second current source and the resistor are coupled to the first input. During operation, the capacitor may charge until the voltage across the capacitor exceeds the voltage across the resistor, causing a discharge circuit to activate to discharge the capacitor. Accordingly, the signal produced by the RC oscillator across the capacitor is a sawtooth wave.

The method may further include calibrating the RC time constant. Based on the mean, a calibration routine may be performed in which the capacitance is adjusted until the oscillator output signal is at a desired period. The calibration may be performed in two different phases, the first in which the RC oscillator is operated in a first (e.g., high) current mode, and a second phase in which the RC oscillator is operated in a second (e.g., low) current mode. In addition, information pertaining to the RC time constant calibration may be provided to an analog-to-digital converter (ADC) in one embodiment for use in setting an RC time constant therein.

BRIEF DESCRIPTION OF THE DRAWINGS

Other aspects of the disclosure will become apparent upon reading the following detailed description and upon reference to the accompanying drawings which are now briefly described.

Figure 1:
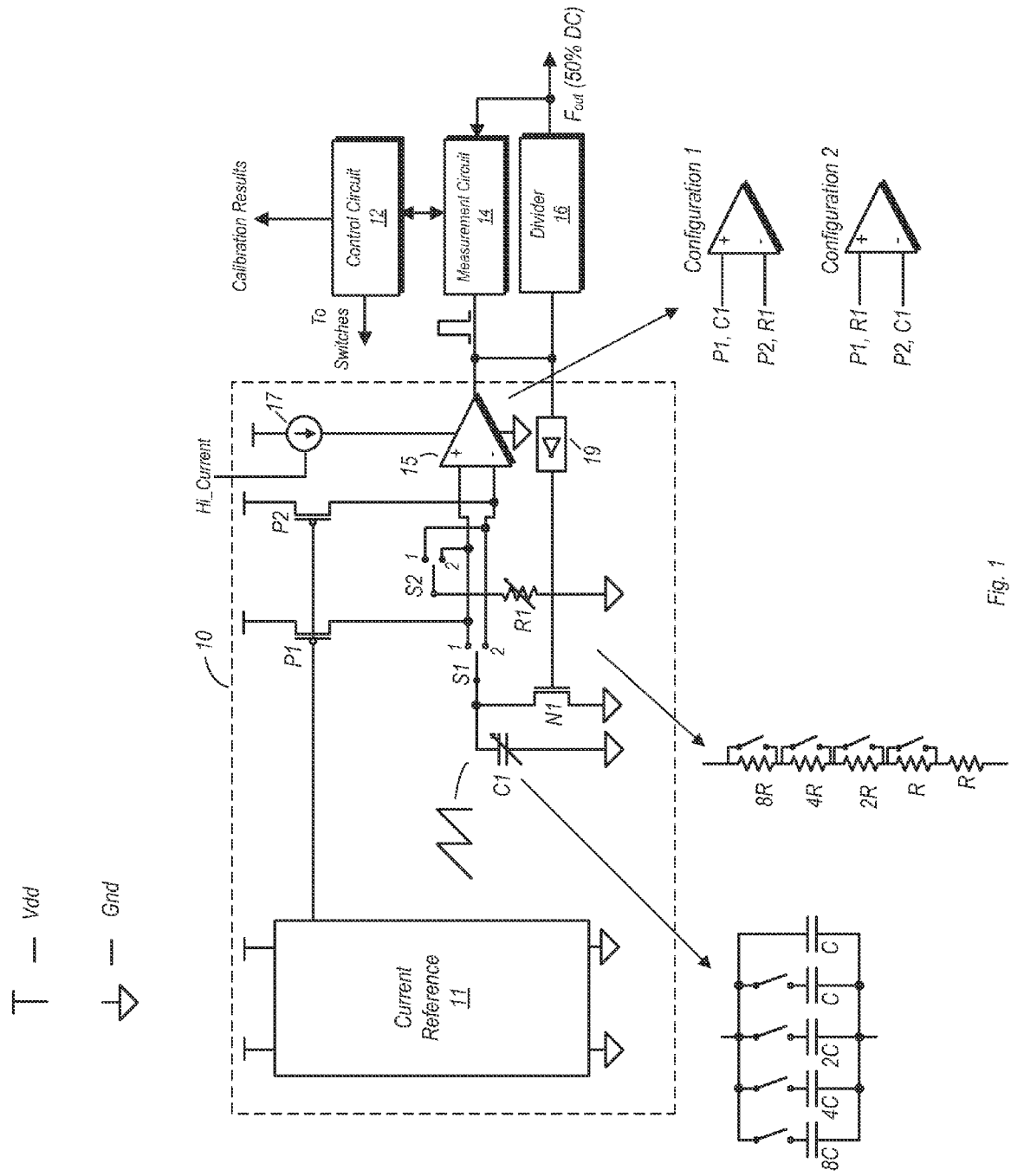
FIG. 1 is a schematic diagram of one embodiment of an oscillator.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Turning now to FIG. 1, a schematic diagram of one embodiment of an oscillator circuit is illustrated. In the embodiment shown, oscillator 10 is an RC (resistive-capacitive) oscillator that includes a variable capacitor C1 and a variable resistor R1. Comparator 15 includes a first input (+) and a second input (−). A discharge transistor N1 is coupled between the output and C1, via selectable inverter 19. During operation of oscillator 10 in a first configuration (in which capacitor C1 is coupled to the first input of comparator 15), capacitor C1 is charged, while the voltage across resistor R1 remains constant. When the voltage across capacitor C1 reaches that across R1, comparator 15 drives its output signal high, thereby activating transistor N1. Capacitor C1 then discharges through the active transistor N1. This causes the output of comparator 15 to fall low again, thereby deactivating transistor N1, and the cycle then repeats. The resultant waveform across capacitor C1 is thus a sawtooth wave. In a second configuration (in which C1 is coupled to the second input of comparator 15), similar operation occurs, with comparator 15 driving its output low when the voltage across capacitor C1 reaches that of R1. In the second configuration, selectable inverter 19 is enabled. Thus a low on comparator 15 is inverted high to activate transistor N1 and discharge capacitor C1. It is noted that selectable inverter 19 is not enabled in the first configuration, and thus the true output of comparator 15 is provided to the gate terminal of transistor N1.

In the embodiment shown, oscillator 10 includes a pair of current sources, implemented as transistors P1 and P2. Transistors P1 and P2, are coupled to the positive and negative terminals of comparator 15, respectively. Switch S1, when in position 1, couples capacitor C1 to the drain terminal of transistor P1 and to the positive input of comparator 15. When in position 2, switch S1 couples capacitor C1 to the drain terminal of transistor P2 and the negative input of comparator 15. When switch S2 is in position 1, resistor R1 is coupled to the drain terminal of transistor P2 and the negative input of comparator 15. Resistor R1 is coupled to the drain terminal of transistor P1 and the positive input of comparator 15 when switch S2 is in position 2. Control circuit 12 in the embodiment shown is coupled to both of switches S1 and S2. Furthermore, control circuit 12 is configured to control switches S1 and S2 such that both are in their respective positions at the same time. That is, both switches are in their respective position 1 or in their respective position 2 at the same time. Accordingly, control circuit 12 is capable of causing oscillator 10 to operate in a first configuration (both switches in position 1) or a second configuration (both switches in position 2).

Transistors P1 and P2 are both coupled to current reference 11. The current through transistors P1 and P2 may be held relatively constant by current reference 11, which may generate a reference current that is copied by these devices. Ideally both transistors P1 and P2 are perfectly matched current sources and would thus provide the same amount of current. However, in practice, some variation exists between transistors P1 and P2, and thus these current sources are mismatched. Due to this mismatch, the current provided by one of transistors P1 and P2 may differ from the other. Accordingly, a frequency of the signal output from comparator 15 (as well as the frequency of the sawtooth wave across capacitor C1) may be different when operating in the first configuration than when operating in the second configuration.

In this particular embodiment, the pulse train from comparator 15 is provided to divider 16, which then provides an output signal. Divider 16 is configured to divide the frequency of the output pulse train provided by comparator 15 and to provide a corresponding output signal, $F_{out}$, having a 50% duty cycle (or approximately 50%). The output of divider 16 may also be coupled to measurement circuit 14, which may measure the frequency of the output signal. In this embodiment, measurement circuit 14 is also coupled to the output of comparator 15, and may measure the frequency of the pulse train output therefrom.

As noted above, the frequency of the output signal (as well as that of the pulse train and the sawtooth wave) may be affected by the current provided by the current sources. In addition, the frequency of these signals may also be affected by an inherent delay in comparator 15. In an ideal environment where the current sources are perfectly matched and the comparator provides zero delay, the RC time constant of oscillator 10 could be measured simply by taking the period of any one of the sawtooth wave, the pulse train from comparator 15, or one half the period of the output signal, $F_{out}$. However, due to the mismatches in the current sources, mismatches in comparator 15 (i.e. the voltages that trigger a change in the output, which can be different for the first and second configurations) and the inherent delay of comparator 15, an alternate methodology may be applied for measuring the RC time constant of oscillator 10.

In order to better approximate the RC time constant of oscillator 10, an average may be taken for the period of two different signals, a first produced when operating in the first configuration and a second produced when operating in the second configuration. During operation in the first configuration, transistor P1 and capacitor C1 are coupled to the first input of comparator 15, while transistor P2 and R1 are coupled to the second input. Measurement circuit 14 may determine a frequency, and thus a period, of the pulse train output by comparator 15 during operation in the first configuration. Control circuit 12 may then set each of switches S1 and S2 to position 2 to configured oscillator 10 for operation in the second configuration. When the switches are in position 2, P1 and C1 are coupled to the second input of comparator 15, while P2 and R1 are coupled to the first input. Again, measurement circuit 14 may determine the frequency and period of the output pulse train. Control circuit 12 may then determine a mean between the first period, obtained from operation in the first configuration, and the second period, obtained from operation in the second configuration. In some embodiments, the determined mean may be a geometric mean. In other embodiments, an arithmetic mean may be used, as it may serve as an adequate approximation of the geometric mean. Methods are also contemplated in which weighted means are determined. In any case, taking the mean of the two periods may average out much of the error produced by the mismatches in the current sources. Error produced by an additional mismatch in comparator 15 may also be averaged out.

To illustrate how taking the mean of the two periods can average out the various sources of error (e.g., due to current mismatches) and delay, consider the following expression for determining the frequency of the pulse train:

$$F_{pt} = \frac{1}{(T_{dly} + \Delta T_{osc} + RC)},$$

in which $F_{pt}$ is the frequency of the pulse train, $T_{dly}$ is the delay through the oscillator (which includes delay through comparator 15), $\Delta T_{osc}$ is indicative of delay due to current source mismatches and the comparator mismatch, and RC is the RC time constant. Thus, the first period is the sum of the delay and the RC time constant. The formula above may apply to operation in a specific one of the two configurations described above. For the opposite configuration, the expression becomes the following:

$$F_{pt} = \frac{1}{(T_{dly} - \Delta T_{osc} + RC)}.$$

Thus, combining these two expressions as a mean, the resulting expression becomes:

$$F_{pt} = \frac{1}{T_{dly} + RC}.$$

When operating oscillator 10 in the high current mode, the delay time may be reduced to a negligible value, and the resulting expression becomes:

$$F_{pt} = \frac{1}{RC}$$

Thus, the average frequency, and thus the average period are dependent on the RC time constant, and therefore the errors are averaged out.

In the illustrated embodiment, comparator 15 is coupled to receive current from current source 17. Current source 17 includes an input coupled to receive a signal indicating whether operation is to occur in a high current mode or a low current mode. When Hi_Current is asserted, current source 17 may cause oscillator to operate in the high current mode. Operation of oscillator 10 in the methodology described above may occur in the high current mode. When operating in the high current mode, the delay provided by comparator 15 (i.e. $T_{dly}$) may be reduced to a negligible value. When Hi_Current is de-asserted, oscillator 10 may operate in a low current mode, and thus the delay through comparator 15 is non-negligible. During operation in the low current mode, the current through current source 17 may be less than that when in the high current mode by a predetermined factor. For example, the current in the high current mode may be four times that of the low current mode in one embodiment. During normal operation (i.e., when not used to determine an RC time constant or perform a calbiration), oscillator 10 may operate in the low current mode.

As will be explained in further detail below, oscillator 10 may be used to calibrate an RC time constant for another circuit within an IC in which both are implemented. Furthermore, a calibration routine to set the output frequency of oscillator 10 to a desired frequency may also be performed. These calibrations may be performed by making adjustments to the capacitance of C1 until the desired values are at or as close as possible to the actual values produced by oscillator 10.

It is noted that while the present disclosure refers adjustment of a capacitance in changing the RC time constant, the disclosure is not intended to be limiting on this point. Thus, embodiments in which the RC time constant is adjusted by changing the resistance, or both the resistance and capacitance, are also possible and contemplated.

Figure 2:
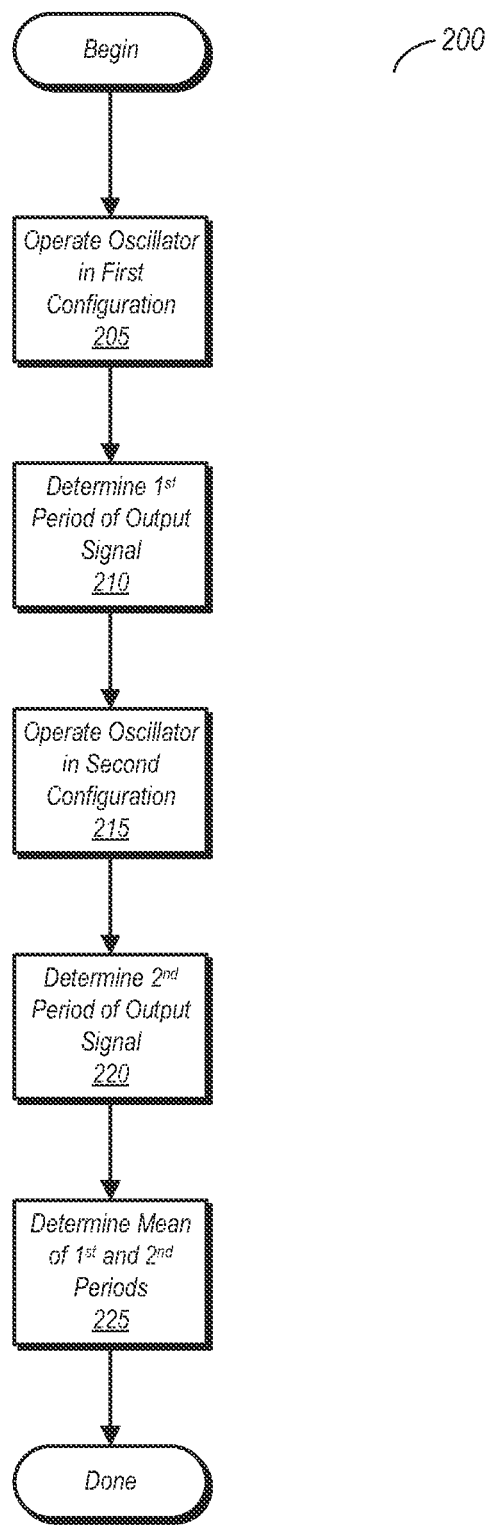
FIG. 2 is a flow diagram of one embodiment of a method for determining an RC time constant.

FIG. 2 is a flow diagram illustrating one embodiment of a method for determining an RC time constant. While method 200 may apply to oscillator 10 as described above, it may also apply to other types of oscillators that may be operated in two different configurations and from which an RC time constant may be determined.

Method 200 begins with the operation of an oscillator in a first configuration (block 205). A period of a signal produced during operation in the first configuration may be determined by a measuring circuit (block 210). The oscillator may then be operated in a second configuration (block 215). The second configuration may be one in which sources of error are reversed relative to the first configuration. A period of a signal produced during operation in the second configuration may is determined (block 220). A mean (geometric or arithmetic) of the first and second determined periods is then calculated to find the RC time constant, or a close approximation thereof.

Figure 3:
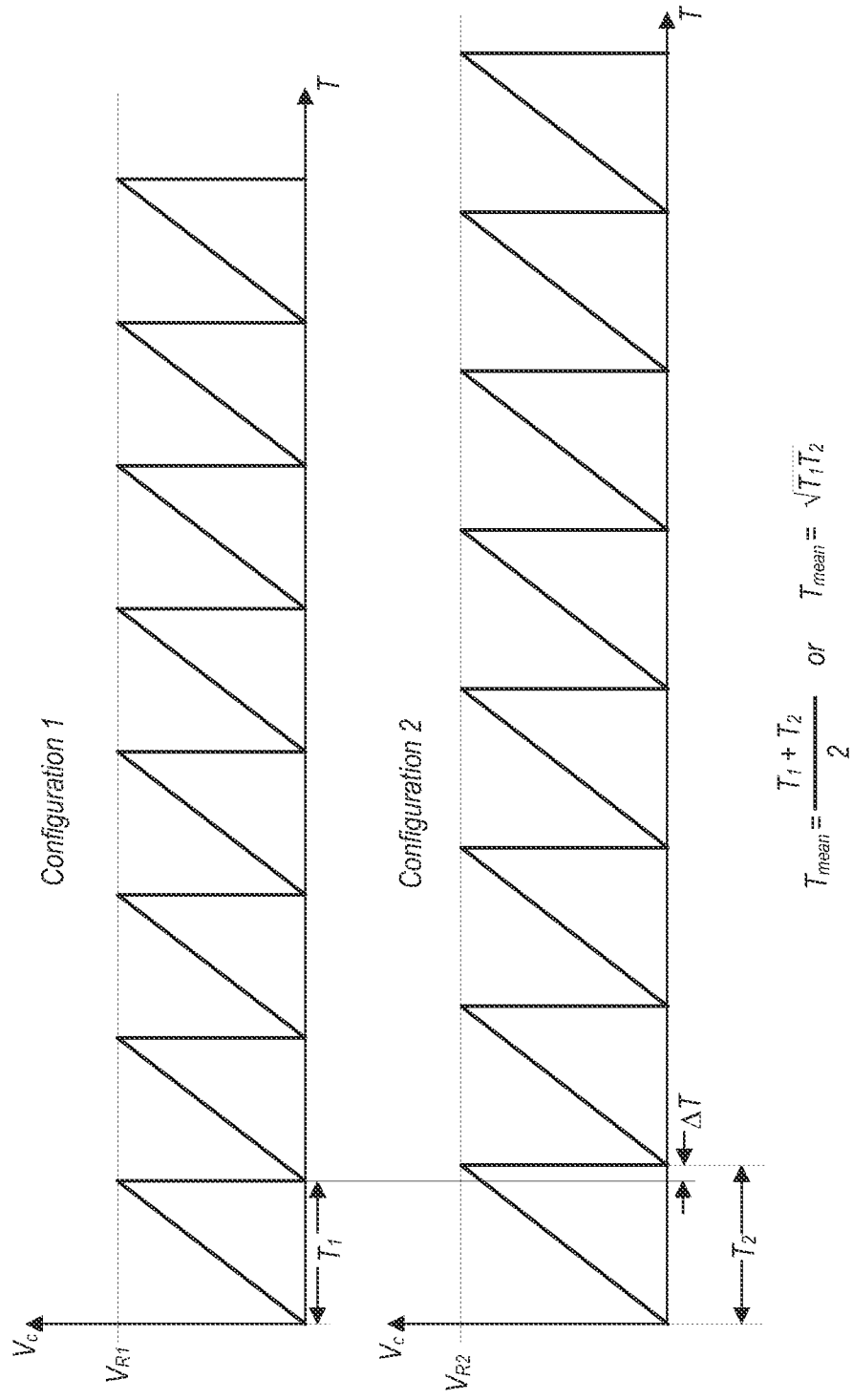
FIG. 3 is an illustration of the oscillator output signals resulting from operation in the first configuration and the second configuration.

FIG. 3 is an illustration of the oscillator output signals resulting from operation in the first configuration and the second configuration for oscillator 10 as illustrated in FIG. 1. More particularly, FIG. 3 illustrates the sawtooth wave that results from the voltage change across capacitor C1 as it charges up and discharges after comparator 15 activates transistor N1 to provide a discharge path.

For both wave forms, the voltage across the capacitor, $V_C$, charges up to that of the voltage across the resistor, $V_R$. Since current reference 11 is configured to cause transistors P1 and P2 to provide a constant current, $V_R$ may remain constant during operation in a particular configuration (although the value may change from one configuration to the next). When $V_C$ reaches a value equivalent to that of $V_R$, comparator 15 provides an output pulse that causes the activation of transistor N1. The voltage developed across C1 is then discharged through transistor N1. At a delay time following the activation of transistor N1, comparator 15 de-asserts the pulse as $V_C$ falls below $V_R$. This cycle repeats itself during the operation of the oscillator 10.

When operating in the first configuration, the resulting sawtooth wave has a period of $T_1$. In the second configuration, the period of the resulting sawtooth wave is $T_2$. In this particular example, $T_2$ is greater than $T_1$ by an amount shown here as $\Delta T$. The value of $\Delta T$ may result from the mismatches in the current sources P1 and P2. Thus, the mean value of these two periods may more closely reflect the actual RC time constant of oscillator 10. As shown in FIG. 3, this mean may be determined as an arithmetic mean, $$T_{mean} = \frac{T_1 + T_2}{2},$$

or a geometric mean, $$T_{mean} = \sqrt{T_1 T_2}.$$

It is noted that these calculations do not factor in the delay provided by comparator 15. The delay may be a systemic factor, and may be substantially the same for operation in either of the configurations discussed herein.

Figure 4:
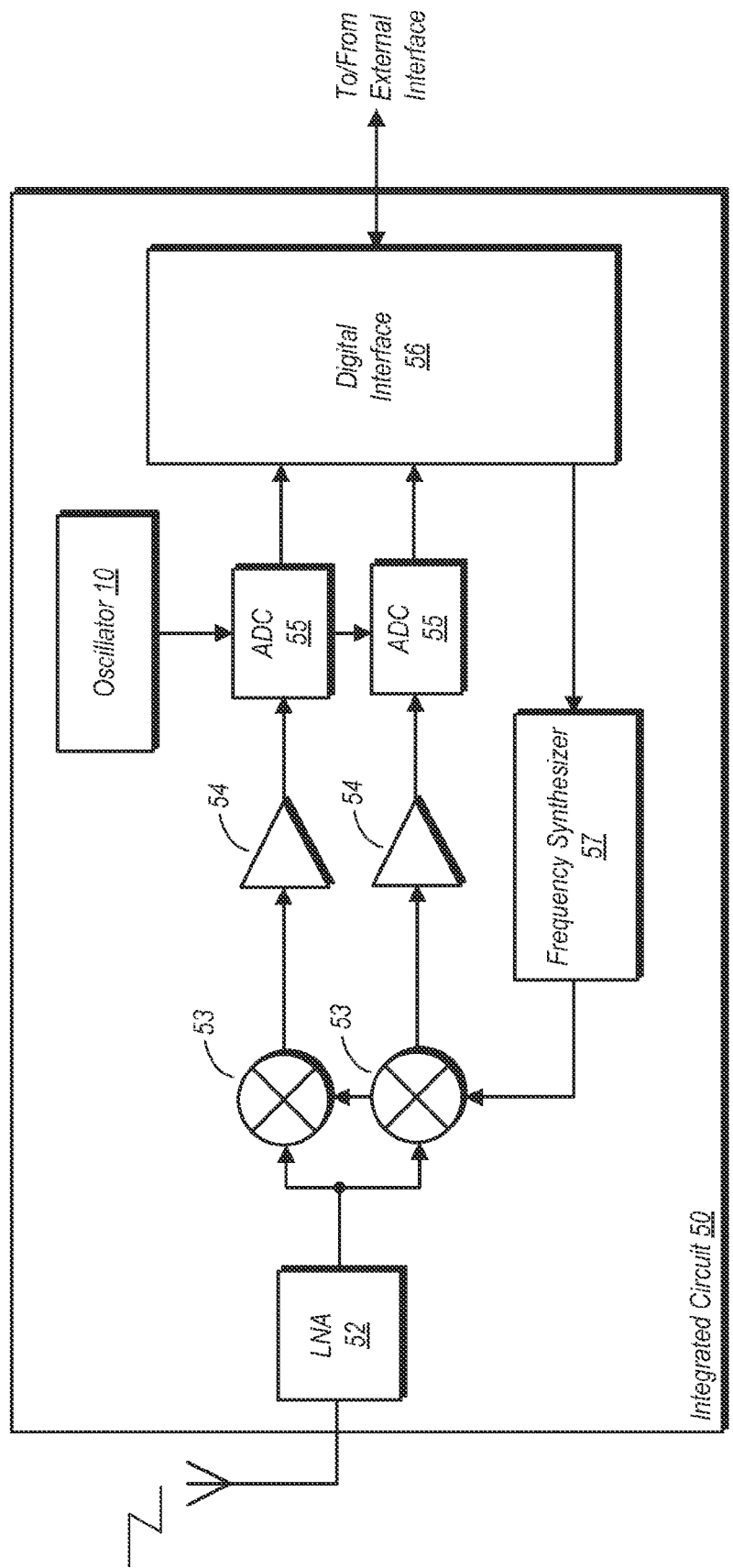
FIG. 4 is a block diagram of one embodiment of an integrated circuit.
Figure 5:
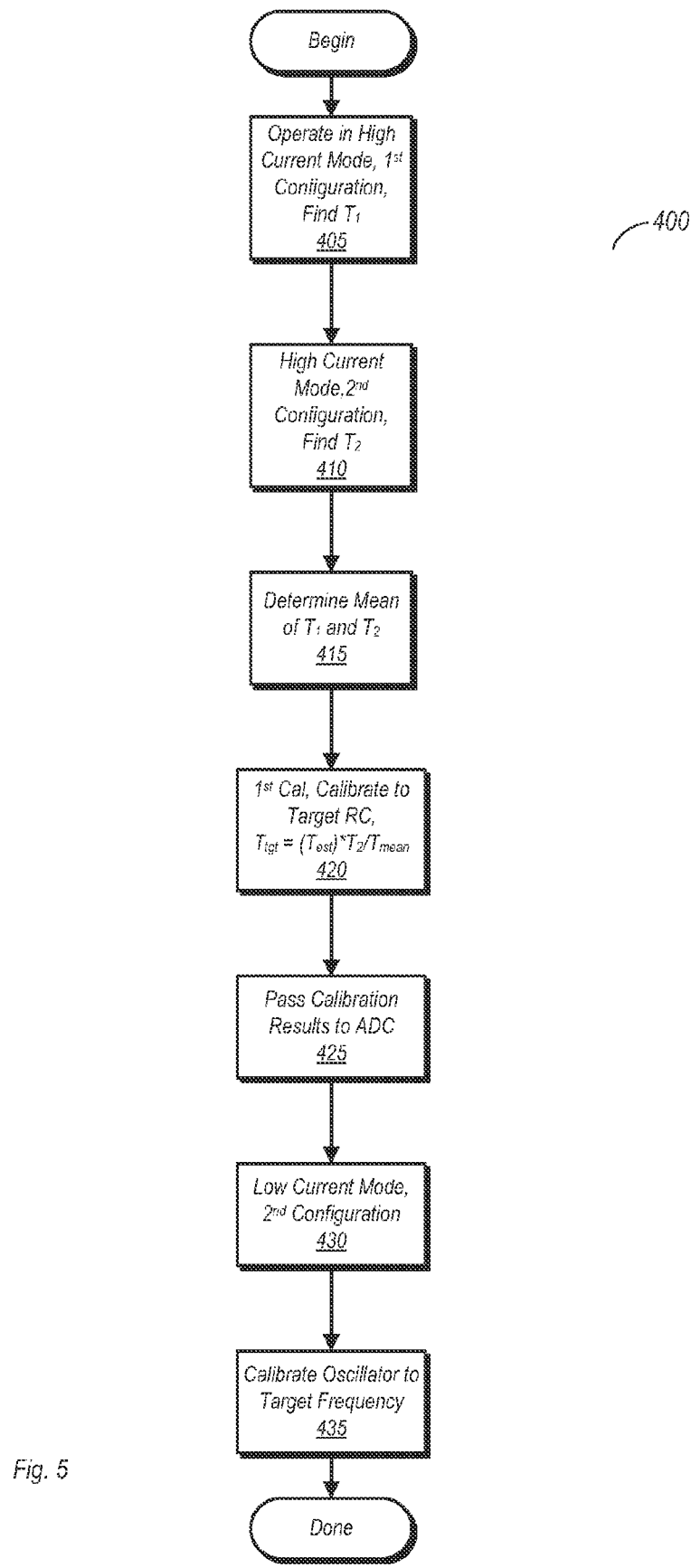
FIG. 5 is a flow diagram illustrating one embodiment of a method for calibrating an RC time constant and an oscillator.

FIGS. 4 and 5 illustrate one possible further use of the ability to determine the RC time constant in the manner described above. In particular, FIG. 4 illustrates an IC for which an embodiment of oscillator 10 may be used to calibrate the RC time constant for another circuit therein, and a subsequent calibration of the frequency of oscillator 10 to a desired value.

Turning now to FIG. 4, an embodiment of an integrated circuit is illustrated as a block diagram. It is noted herein that FIG. 4 illustrates only some of the basic components that may be present in such an integrated circuit, and that numerous other components may be present in an actual implementation. Accordingly, the embodiment shown here is not intended to be limiting.

Integrated circuit 50 in the embodiment shown is a radio receiver that may receive and detect radio signals. The radio signals may be provided from an antenna to a low noise amplifier (LNA) 52. Amplified signals output by LNA 52 may be provided to a pair of mixers 53. Mixers 53 in the embodiment shown are also each coupled to receive a periodic signal from frequency synthesizer 57. The modulated radio signals received by each mixer 53 may be combined with the respective periodic signal received from frequency synthesizer 57 to produce a down-converted signal. In one embodiment, integrated circuit 50 may implement a heterodyne receiver, and thus the output signals provided by mixers 53 are intermediate frequency (IF) signals. In another embodiment, integrated circuit 50 may implement a direct conversion receiver, and thus the output signals provided by mixers 53 are baseband signals. In either case, the signals output by mixers 53 may be received by respectively coupled amplifiers 54 for further amplification. Although not explicitly shown, the signal paths shown here may also include filters, which may be either bandpass filters (in heterodyne receiver embodiments) or lowpass filters (in direct conversion embodiments). The signals output from amplifiers 54 may each be received by a respectively coupled analog-to-digital converter (ADC) 55, which converts a signal to digital format and provides it to digital interface 56. Digital interface 56 may provide further processing of received data before outputting it to an external interface.

In the embodiment shown, each ADC 55 may include integrator circuits that can be characterized by a transfer function having one or more poles and one or more zeros. The poles may be dependent upon having a correct value of an RC time constant. Accordingly, oscillator 10 may perform an RC time constant calibration routine and provide results to each of ADC's 55.

Each ADC 55 may include a variable capacitance that is arranged as closely as possible to the variable capacitance in oscillator 10. Referring briefly back to FIG. 1, capacitor C1 is implemented as a binary weighted variable capacitor, with separate legs having values of 8C, 4C, 2C, and C, with one extra capacitor leg that also provides a value of C and is permanently switched on. Accordingly, capacitor C1 may be adjusted to any capacitance value between C and 16C. The variable capacitances in each ADC 55 may be arranged in the same manner. More particularly, the widths, areas, circuit topology, and amount of capacitance provided by each leg of variable capacitors in each ADC 55 may be as closely matched to that of oscillator 10 as possible. This may enable oscillator 10 to be used to calibrate an RC time constant to a desired value for each ADC 55. When the RC calibration is complete, oscillator 10 may provide a calibration value (e.g., in the form of a digital value) to each ADC 55, which may then set its own variable capacitance in accordance with the value received. After the RC calibration is complete, the frequency of an output signal provided by oscillator 10 may be different from that which is desired for operation of integrated circuit 50. This difference may be due to several factors. One factor is that during normal operation, oscillator 10 operates in the low current mode, while operating in the high current mode during the RC calibration (and thus reducing the delay provided by comparator 15 to a negligible value). Furthermore, the RC value to which oscillator is calibrated during the RC calibration may be different from that which is required to produce the desired operational frequency. Due to these factors, a second calibration of oscillator 10 may be performed subsequent to performing the RC calibration. The second calibration may be directed to calibrating the frequency of oscillator 10 to its desired operational frequency.

Turning now to FIG. 5, a flow diagram of a calibration method is illustrated. Method 400 includes both a calibration of an RC time constant and a subsequent calibration of the frequency of a signal produced by oscillator 10.

Method 400 begins with the operation of oscillator 10 in the high current mode, first configuration, with a determination of a first period $T_1$ produced by the oscillator (block 405). The oscillator may be operated in the second configuration (remaining in the high current mode), and a determination of a second period $T_2$ is made (block 410). The mean of $T_1$ and $T_2$ is then determined in the manner previously described (block 415).

Based on the mean of $T_1$ and $T_2$, a calibration to a target time value, $T_{tgt}$, may be performed (block 420). More particularly, $T_{tgt}$ may represent a desired RC time constant for each ADC 55. This value may be computed by the following formula:

$$T_{tgt} = \frac{T_{est} \times T_2}{T_{mean}},$$

wherein $T_{est}$ is an estimated RC time constant, while $T_2$ and $T_{mean}$ are the second period and mean period obtained as previously described. The estimated RC time constant may be obtained from simulation results that do not factor in the various sources of error or the operational configuration of oscillator 10. It is further noted that this formula is exemplary and may not apply to other implementations. In general, the calculation of a target RC time constant may be tailored to the specific implementation of circuitry for which it is to be obtained.

In the embodiment shown, the calibration performed in block 420 is based on a successive approximation. During the original determination of $T_1$, $T_2$ and $T_{mean}$, the capacitance of C1 may be set to a midrange value (e.g., 8C for the embodiment shown in FIG. 1). Control circuit 12 may compare the target RC time constant value to the RC time constant value obtained with the capacitance at midrange, and determine whether the capacitance is to be increased or decreased. The capacitance may then be adjusted using binary weighting. For example, if the original value is 8C and the obtained RC time constant value is too low, the capacitance may be increased by a value of 4C. The oscillator may be operated again (remaining in the second configuration, high current mode), with a resulting RC time constant obtained. This period is then compared to the target value to determine if further adjustments are to be performed. If the resulting RC time constant is too high, the capacitance may be reduced, otherwise it may be increased if too low. Using the example in which the capacitance was increased to 12C, if the resulting RC time constant is greater than the target value at this point, the capacitance may be reduced by 2C. Oscillator 10 may again be operated, with another RC time constant value obtained. This process may be repeated as often as appropriate or desired until the obtained RC time constant value is as closely matched to the target value as possible. After the final RC time constant value is obtained, the results may be passed to each ADC 55 (block 425). The ADC's 55 may then set their respective capacitance values to the same as that of oscillator 10 for which the final RC time constant value was obtained. The RC calibration is then considered complete. Note that the embodiment of FIG. 4 illustrates a block diagram and signal flow, and not necessarily a circuit implementation. For example, rather than using separate ADCs as illustrated in the exemplary embodiment of FIG. 4, a single ADC may be used.

After completion of the RC calibration, oscillator 10 may be calibrated to its operational frequency. To perform this calibration, oscillator 10 is switched to the low current mode (in which it may operate under normal, non-calibration conditions), while remaining in the second configuration (block 430). A calibration of the frequency may be performed in a manner similar to the calibration of the RC time constant (block 435), while remaining in the low current mode and second configuration throughout. More particularly, oscillator 10 may be operated to determine a period of oscillation, with the obtained period of oscillation being compared to a period corresponding to a target frequency. The capacitance of variable capacitor C1 may be adjusted in a successive approximation during each iteration until the target frequency is obtained. In some embodiments, the resistance of resistor R1 may be varied instead of, or in addition to, the capacitance. When the frequency of a signal produced by oscillator 10 is equal to the target frequency (or a sufficiently close approximation thereof), method 400 is complete.

The example of using the RC oscillator to perform an RC calibration as discussed above, with a subsequent frequency calibration, is presented here as one example of many possible embodiments. In general, the disclosure contemplates using an oscillator to determine an RC time constant based on operating it in first and second configurations to average out errors. The disclosure further contemplates using the determined RC time constant as a basis for a subsequent RC time constant calibration, and may also include a subsequent frequency calibration of the oscillator if the oscillator itself is to be used to provide a periodic signal for general system operation.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method comprising:
   determining a first period of oscillation of an oscillator having a comparator with first and second inputs, wherein the first period is determined with the oscillator operating in a first configuration in which the first input is coupled to a capacitor and the second input is coupled to a resistor;
   while the oscillator is operating in a second configuration, determining a second period of oscillation of the oscillator while the oscillator is operating in a second configuration in which the first input is coupled to the resistor and the second input is coupled to the capacitor; and
   a measurement circuit determining a value of an RC (resistive-capacitive) time constant of the oscillator based on the first and second oscillation periods.

2. The method as recited in claim 1, further comprising determining the RC time constant based on an arithmetic mean of the first and second oscillation periods.

3. The method as recited in claim 1, further comprising determining the RC time constant based on a geometric mean of the first and second oscillation periods.

4. The method as recited in claim 1, wherein the oscillator is an RC oscillator and further comprises a first current source and a second current source wherein the first input of the comparator is coupled to the first current source and wherein the second input of the comparator is coupled to the second current source.

5. The method as recited in claim 4, further comprising:
   operating the RC oscillator in a high current mode;
   calibrating the RC oscillator to a first target period, wherein the first target period is based on a mean of the first period and the second period, and wherein the first target period is a product of an estimated target period and a ratio between the second period and the mean of the first and second period.

6. The method as recited in claim 5, further comprising:
   providing, to an analog-to-digital converter (ADC), results of said calibrating the RC oscillator to the first target period; and
   the ADC setting an internal capacitance value to a value based on the results of said calibrating.

7. The method as recited in claim 5, wherein determining the first period and determining the second period are performed in the high current mode.

8. The method as recited in claim 5, further comprising:
   operating the RC oscillator in a low current mode while in the second configuration; and
   calibrating the RC oscillator to a second target period.

9. The method as recited in claim 8, wherein the capacitor is a variable capacitor, and wherein a capacitance of the variable capacitor is set to a specified value during said determining the first period and said determining the second period.

10. The method as recited in claim 9, further comprising:
    during said calibrating the RC oscillator to the first target period, performing a first successive approximation in which the variable capacitance is adjusted until a period of the RC oscillator output signal is the first target period; and
    during said calibrating the RC oscillator to the second target period, performing a second successive approximation in which the variable capacitance is adjusted until the period of the RC oscillator output signal is the second target period.

11. An apparatus comprising:
    an oscillator having a comparator with first and second inputs;
    a control circuit configured to cause the oscillator to operate in first configuration in which the first input is coupled to a capacitor and the second input is coupled to a resistor, and a second configuration in which the first input is coupled to the resistor and the second input is coupled to the capacitor; and
    a measurement circuit coupled to an output of the oscillator and configured to measure a first period of an oscillator output signal when the oscillator is operating in a first configuration, measure a second period of the oscillator output signal when the oscillator is operating in the second configuration, and determine an RC time constant based on a mean of the first period and the second period.

12. The apparatus as recited in claim 11, wherein the mean of the first and second periods is an arithmetic mean.

13. The apparatus as recited in claim 11, wherein the mean of the first and second periods is a geometric mean.

14. The apparatus as recited in claim 11, wherein the oscillator is an RC (resistive-capacitive) oscillator including:
    a first current source coupled to the first input;
    a second current source coupled to the second input; and
    a switching circuit configured to, in the first configuration, couple the capacitor to the first input and couple the resistor to the second input, and further configured to, in the second configuration, couple the capacitor to the second input and couple the resistor to the first input.

15. The apparatus as recited in claim 14, wherein the RC oscillator is configured to produce a sawtooth signal on a first terminal of the capacitor.

16. The apparatus as recited in claim 14, wherein the capacitor is a variable capacitor and the resistor is a variable resistor.

17. The apparatus as recited in claim 14, wherein the control circuit is further configured to perform a frequency calibration of the RC oscillator, wherein performing the frequency calibration comprises performing a successive approximation in which a capacitance of the variable capacitor is adjusted until a frequency of the oscillator output signal is at a target frequency.

18. The apparatus as recited in claim 17, wherein the RC oscillator is configured to operate in one of a high current mode or a low current mode, and wherein the control circuit is configured to cause the RC oscillator to operate in the high current mode during an RC calibration routine that includes measuring of the first and second periods of the RC oscillator output signal, and wherein the control circuit is further configured to cause the RC oscillator to operate in the low current mode during the frequency calibration.

19. A method comprising:
    operating an RC (resistive-capacitive) oscillator in a first configuration, wherein the first configuration includes coupling a first current source and a capacitor to a first comparator input and coupling a second current source and a resistor to a second comparator input;
    determining a first period of an output signal provided by the RC oscillator during operation in the first configuration;

operating the RC oscillator in a second configuration, wherein the second configuration includes coupling the first current source and the capacitor to the second comparator input and coupling the second current source and the resistor to the first comparator input;

determining a second period of the output signal during operation in the second configuration; and determining an RC time constant of the RC oscillator based on a mean of the first period and the second period.

20. The method as recited in claim 19, further comprising:

operating the RC oscillator in a first current mode during said determining the first period and determining the second period;

performing an RC calibration while operating in the first current mode, wherein said performing the RC calibration comprises adjusting a capacitance of the capacitor;

setting a capacitance value in an analog-to-digital converter (ADC) based on results obtained from performing the calibration in the high current mode; and performing a frequency calibration while operating in a second current mode, wherein said performing the frequency calibration comprises additional adjustments of the capacitance of the capacitor.

* * * * *